US007705522B2

(12) United States Patent
Gandhi

(10) Patent No.: US 7,705,522 B2
(45) Date of Patent: Apr. 27, 2010

(54) ADJUSTABLE SOUND PANEL WITH ELECTROACTIVE ACTUATORS

(75) Inventor: Umesh N. Gandhi, Farmington Hills, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 0 days.

(21) Appl. No.: 12/134,786

(22) Filed: Jun. 6, 2008

(65) Prior Publication Data

US 2009/0301810 A1 Dec. 10, 2009

(51) Int. Cl.
*H01L 41/08* (2006.01)

(52) U.S. Cl. ........................ 310/328; 310/340; 310/800

(58) Field of Classification Search ................. 310/328, 310/800

See application file for complete search history.

(56) References Cited

U.S. PATENT DOCUMENTS

| | | | | |
|---|---|---|---|---|
| 3,816,774 | A * | 6/1974 | Ohnuki et al. | 310/332 |
| 4,926,963 | A * | 5/1990 | Snyder | 181/290 |
| 5,024,288 | A * | 6/1991 | Shepherd et al. | 181/206 |
| 5,429,449 | A | 7/1995 | Baatz | |
| 5,485,053 | A * | 1/1996 | Baz | 310/326 |
| 5,498,127 | A * | 3/1996 | Kraft et al. | 415/119 |
| 5,912,442 | A * | 6/1999 | Nye et al. | 181/292 |
| 5,919,029 | A * | 7/1999 | Van Nostrand et al. | 415/119 |
| 6,191,519 | B1 * | 2/2001 | Nye et al. | 310/316.01 |
| 6,299,410 | B1 * | 10/2001 | Hilbert et al. | 416/145 |
| 6,545,384 | B1 | 4/2003 | Pelrine et al. | |
| 6,694,213 | B2 * | 2/2004 | Claesson et al. | 700/169 |
| 6,700,304 | B1 * | 3/2004 | Fuller et al. | 310/321 |
| 6,781,284 | B1 | 8/2004 | Pelrine et al. | |
| 6,882,086 | B2 | 4/2005 | Kornbluh et al. | |
| 6,897,599 | B2 * | 5/2005 | Sorg et al. | 310/326 |
| 7,068,794 | B2 * | 6/2006 | Kim | 381/71.7 |
| 7,248,704 | B2 * | 7/2007 | Carme et al. | 381/71.5 |
| 7,259,503 | B2 | 8/2007 | Pei et al. | |
| 7,264,271 | B2 * | 9/2007 | Barvosa-Carter et al. | 280/751 |
| 7,275,846 | B2 | 10/2007 | Browne et al. | |
| 7,284,786 | B2 | 10/2007 | Browne et al. | |
| 7,293,836 | B2 | 11/2007 | Browne et al. | |
| 2002/0101135 | A1 * | 8/2002 | Giovanardi et al. | 310/328 |

(Continued)

FOREIGN PATENT DOCUMENTS

JP 2002-278346 A 9/2002

(Continued)

*Primary Examiner*—J. SanMartin
(74) *Attorney, Agent, or Firm*—Gifford, Krass, Sprinkle, Anderson & Citkowski, P.C.

(57) ABSTRACT

A panel that can change its stiffness and/or surface roughness and thereby its sound quality is provided. The panel includes a layer having an outer surface and an inner surface oppositely disposed from the outer surface. The panel can also include an electroactive actuator that is operable to change its shape when a voltage is applied thereto. The change in shape of the electroactive actuator results in a change in stiffness and/or surface roughness of the panel and therefore a change in the panel's acoustic characteristics. In some instances, the electroactive actuator is at least partially within the panel and upon changing of its shape results in a change in the roughness of a surface that faces a sound source. In other instances, the activation of the electroactive actuator results in an increase in stiffness of the panel.

19 Claims, 3 Drawing Sheets

U.S. PATENT DOCUMENTS

2007/0169991 A1* 7/2007 Bertsch ...................... 181/290
2007/0200467 A1* 8/2007 Heydt et al. ................. 310/800
2009/0045042 A1* 2/2009 Browne et al. ......... 204/157.15
2009/0047197 A1* 2/2009 Browne et al. .............. 422/307

FOREIGN PATENT DOCUMENTS

KR 100511682 8/2005
KR 20-0432530 12/2006

* cited by examiner

ADJUSTABLE SOUND PANEL WITH ELECTROACTIVE ACTUATORS

FIELD OF THE INVENTION

The present invention is directed to a sound panel, and more particularly to a sound panel that can be adjusted.

BACKGROUND OF THE INVENTION

Sound quality can be defined as the physical pleasure or fatigue experienced by a listener and is typically characterized in a live setting by the skill of musicians, tonal quality of their musical instruments and the physical traits of the venue. Related to effecting sound quality, architectural acoustics is the science of controlling sound within buildings and can be broken into four general areas: (1) analysis of the exterior envelope of the building; (2) analysis of noise transmission from one building space to another; (3) analysis of the surfaces of interior spaces of the building; and (4) analysis of mechanical equipment noise generated within the building. Motor vehicles, military vehicles, aircraft and the like can use a similar approach by analyzing the exterior envelope of the vehicle, the noise transmitted from one space of the vehicle to another space, the characteristics of the surfaces of the interior spaces of the vehicle and noise generated by mechanical equipment of the vehicle. However, a motor vehicle, military vehicle, aircraft and the like has an additional complication of having a mobile interior space that is exposed to a wide range of noise scenarios, some changing within a given trip, mission and/or ride in the vehicle.

Looking particularly at the interior space within such vehicles, one method to control sound therein is to use fabric to cover interior surfaces in order to absorb the sound. However, fabric surfaces can be difficult to clean and it can be desirable for a surface to reflect sound rather than absorb it. Therefore, a panel or a surface on a panel that can change or alter its acoustic characteristics as a function of time, noise scenario and/or occupant instruction would be desirable.

SUMMARY OF THE INVENTION

A panel that can change its stiffness and/or surface roughness and thereby its sound quality is provided. The panel includes a layer having an outer surface and an inner surface oppositely disposed from the outer surface. The panel can also include an electroactive actuator that is operable to change its shape when a voltage is applied thereto. The change in shape of the electroactive actuator results in a change in stiffness and/or surface roughness of the panel and therefore a change in the panel's acoustic characteristics. In some instances, the electroactive actuator is at least partially within the panel and upon changing of its shape results in a change in the roughness of a surface that faces a sound source. In other instances, the activation of the electroactive actuator results in an increase in stiffness of the panel.

The panel can be made from one layer, or in the alternative can be made from more than one layer. For example, the panel can be made from an outer layer having a surface that faces a sound source, with an oppositely disposed surface being in contact with an inner layer that has an electroactive actuator at least partially therein. Upon activation of the electroactive actuator and its change in shape, the surface roughness and/or stiffness of the outer layer is altered. In addition, a panel can include an outer layer supported by a substrate, the substrate having the outer layer on one surface and the inner layer with the electroactive actuator therein on an opposing surface.

Similar to the one layer and two layer panels described above, activation of the electroactive actuator and change in its shape results in a change in the surface roughness and/or stiffness of the outer layer.

In some instances, the electroactive actuator can be an electroactive polymer, the electroactive polymer being a dielectric electroactive polymer or an ionic electroactive polymer. An electrical source of power can also be included which can provide a voltage to the electroactive actuator. In addition, the electroactive actuator at least partially within a layer can be a plurality of electroactive actuators that are electrically connected to the electrical source of power and are spaced apart at predetermined distances from each other.

DETAILED DESCRIPTION OF THE INVENTION

The present invention is directed generally to a panel with acoustic characteristics that can be altered. As such the panel has utility as a component for improving the sound quality of a vehicle.

The panel disclosed herein includes a layer that has at least one electroactive actuator at least partially therein. The panel can include a single layer where the electroactive actuator is at least partially therein, activation of the electroactive actuator resulting in a change of the shape thereof and a subsequent change in the surface roughness and/or stiffness of the layer. In the alternative, the panel can be made from two layers, an outer layer having a surface that faces a sound source and an inner layer oppositely disposed therefrom, the inner layer having an electroactive actuator at least partially therein. Similar to the one layer panel, activation of the electroactive actuator results in a change of the shape thereof and a subsequent change in the surface roughness and/or stiffness of the outer layer and thus the panel. Another illustrative example is provided wherein a panel is made from three layers; an outer layer that has a surface that faces a sound source, a substrate that provides backing and support to the outer layer and a third layer that has an electroactive actuator at least partially therein. Activation of the electroactive actuator that is at least partially within the third layer causes a change of the shape thereof and thus a subsequent change in the surface roughness and/or stiffness of the outer layer.

It is appreciated that the electroactive actuator can be an electroactive polymer that is made from a dielectric electroactive polymer or an ionic electroactive polymer. If a dielectric electroactive polymer is used, the polymer can be made from silicones and acrylic elastomers.

Figure 1A:
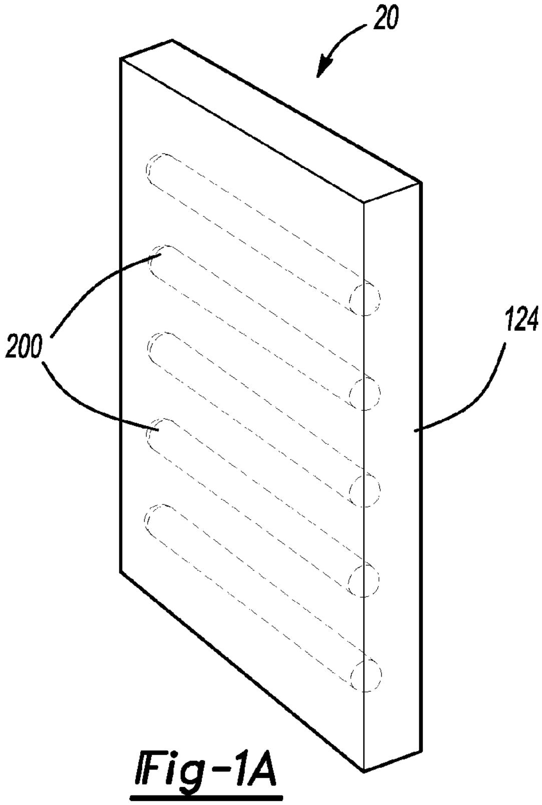
FIG. 1A is a perspective view of an embodiment of the present invention.
Figure 1B:
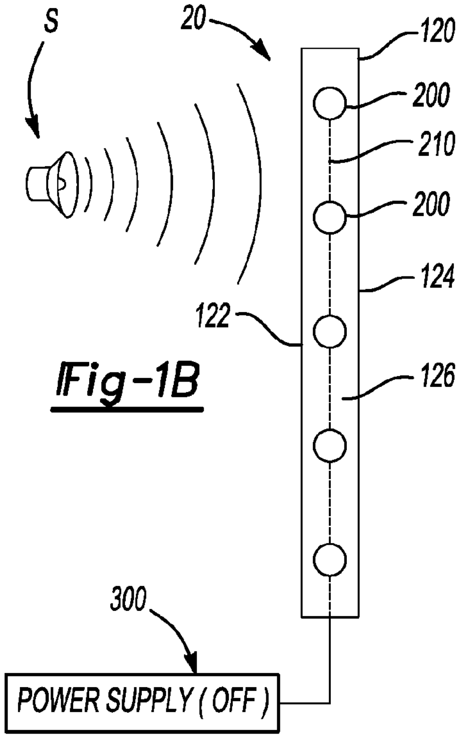
FIG. 1B is a side view of the embodiment shown in FIG. 1A.
Figure 1C:
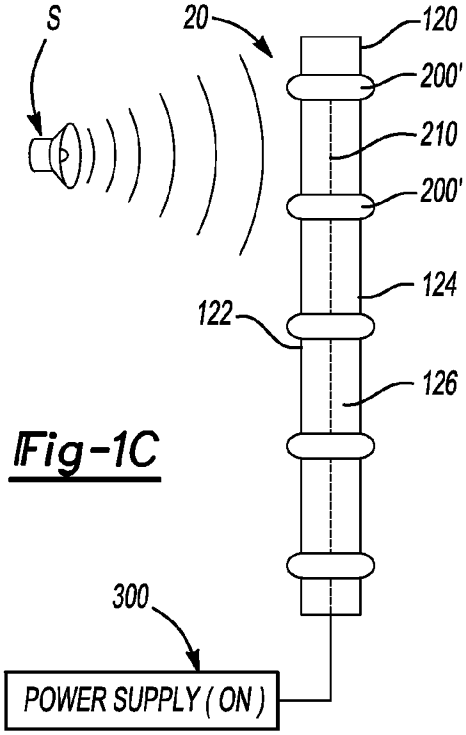
FIG. 1C is the embodiment shown in FIG. 1B illustrating activation of an electroactive actuator in a first orientation.
Figure 1D:
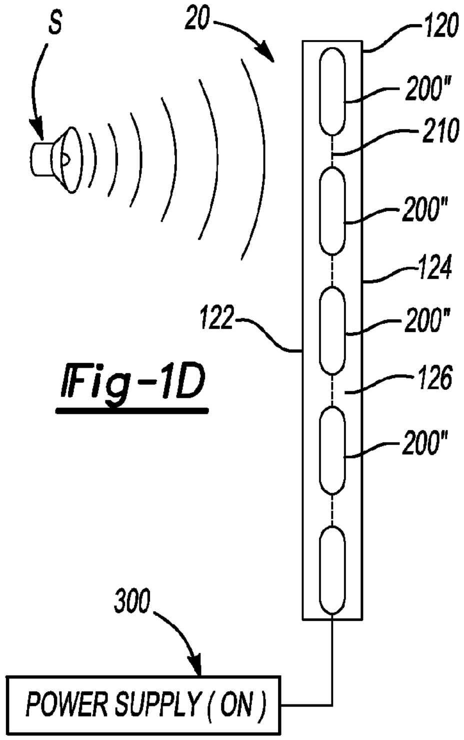
FIG. 1D is the embodiment shown in FIG. 1B illustrating activation of an electroactive actuator in a second orientation.

Turning now to FIGS. 1A-1D, an embodiment of the panel disclosed herein is shown generally at reference numeral 20. The panel 20 includes a layer 120 having an outer surface 122 that faces a sound source S and an inner surface 124 oppositely disposed therefrom. Optionally included between the surface 122 and the surface 124 can be a fill material 126. In some instances, the fill material 126 can be a foam material. At least partially within the layer 120 is an electroactive actuator 200 that is electrically connected to a power supply 300 via an electrical lead 210, or in the alternative using a plurality of electrical leads 210. In some instances, a plurality of electroactive actuators 200 that are spaced apart by predetermined distances can be provided. As shown in FIG. 1B, when the power supply 300 is off, the electroactive actuators 200 exist in their natural state. In contrast, FIG. 1C illustrates the activation of the electroactive actuators 200 as illustrated by reference numeral 200' wherein the electroactive actuator 200 expands in a direction generally perpendicular to the outer surface 122. In the alternative, FIG. 1D illustrates the activation of the electroactive actuators 200 as illustrated by reference numeral 200" wherein the electroactive actuator 200 expands in a direction generally parallel to the outer surface 122. As illustrated in FIGS. 1C and 1D, the activation of the electroactive actuator 200 as represented by reference numerals 200' and 200", and the change in shape thereof, can result in a change in the shape and/or surface roughness of the panel as shown in FIG. 1C or a change in the shape and/or stiffness of the panel as best illustrated in FIG. 1D. It is appreciated that the panel 20 can have a plurality of electroactive actuators with a given number that expand in a direction generally perpendicular to the outer surface 122 and a given number that expand in a direction generally parallel to the outer surface 122. In addition, the panel 20 can have a plurality of electroactive actuators that expand in a variety of different directions relative to the outer surface 122. Furthermore, it may or may not be required or necessary for the voltage to remain applied to the electroactive actuator 200 in order for the actuator to maintain its expanded shape.

Although not shown, a second layer can be placed on either side of the layer 120, that is either on the side facing the sound source S or on the side opposite thereof. In this manner, the panel 120 can alter its sound quality by applying a voltage to an electroactive actuator within the panel.

Figure 2A:
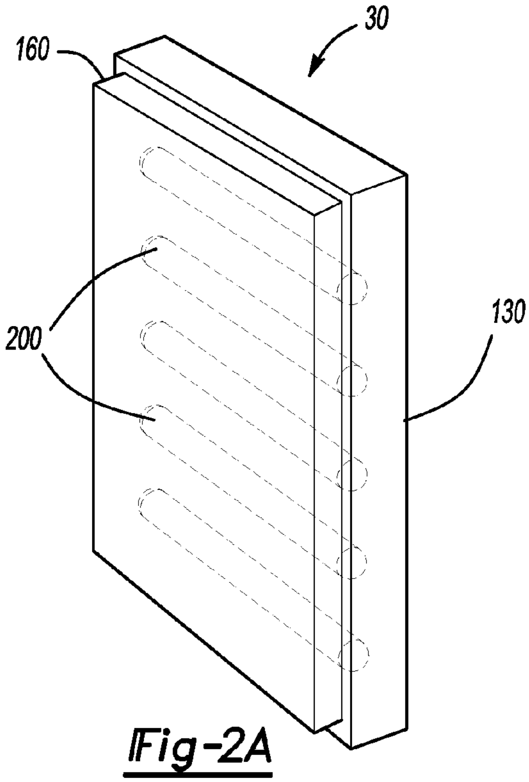
FIG. 2A is a perspective view of another embodiment of the present invention.
Figure 2B:
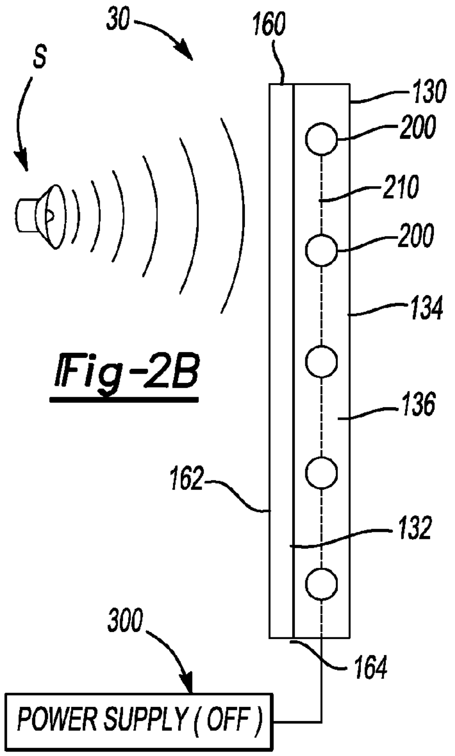
FIG. 2B is a side view of the embodiment shown in FIG. 2A.
Figure 2C:
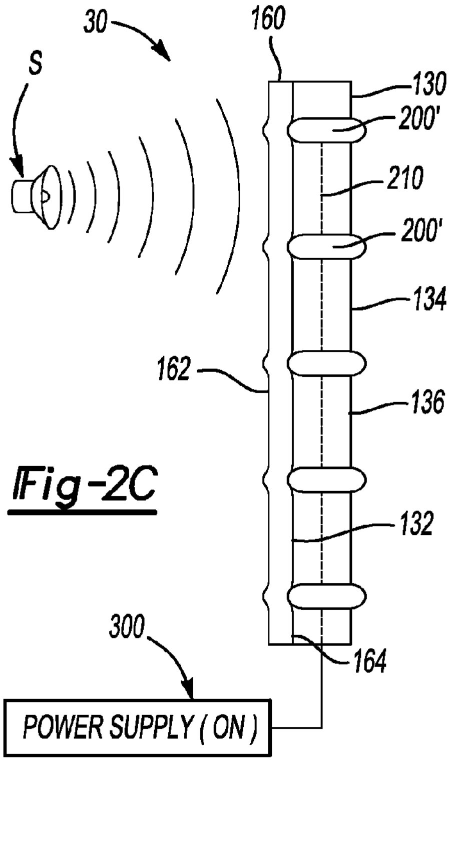
FIG. 2C is the embodiment shown in FIG. 2B illustrating activation of an electroactive activator in a first orientation.
Figure 2D:
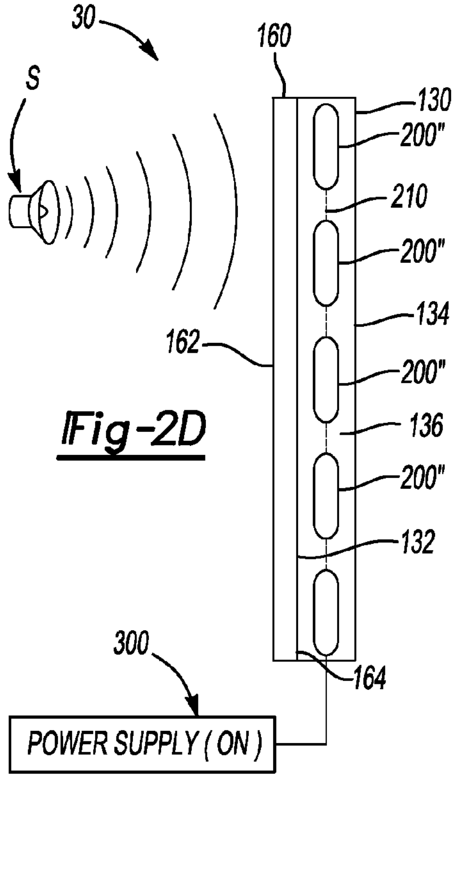
FIG. 2D is the embodiment shown in FIG. 2B illustrating activation of an electroactive activator in a second orientation.

Turning now to FIGS. 2A-2D, another embodiment of a panel is shown generally at reference numeral 30. In this embodiment, the panel 30 is made from an outer layer 160 and an inner layer 130. The outer layer 160 has an outer surface 162 that faces the sound source S and an oppositely disposed surface 164 that faces the second layer 130. The inner layer 130 has a surface 132 that is adjacent to the surface 164 of the outer layer 160 and a surface 134 oppositely disposed surface 132. Optionally included between the surface 132 and the surface 134 can be a fill material 136. Located at least partially within the layer 130 is the electroactive actuator 200, or in the alternative the plurality of electroactive actuators 200 that are electrically connected to the power supply 300 using the electrical lead 210. As shown in FIGS. 2C and 2D, activation of the electroactive activators 200 that are at least partially within the inner layer 130 results in a change in their shape as illustrated by reference numerals 200' and 200". The change in shaper thereby affords for a change in the surface roughness and/or stiffness of the second layer 130 and also the panel 30. Although the activated electroactive actuators 200' and 200" illustrate the electroactive actuator 200 changing its shape in two different directions, it is appreciated that a change in shape in other directions can be provided and included within the scope of this disclosure.

Figure 3A:
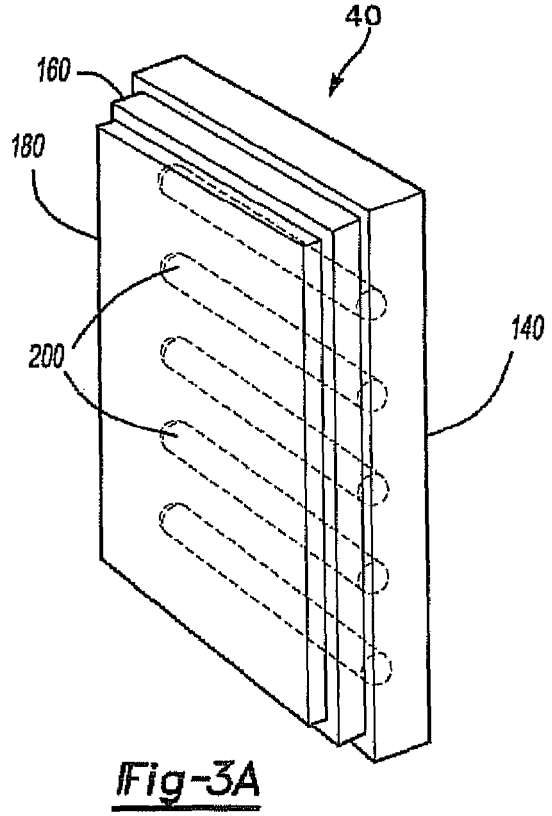
FIG. 3A is a perspective view of another embodiment of the present invention.
Figure 3B:
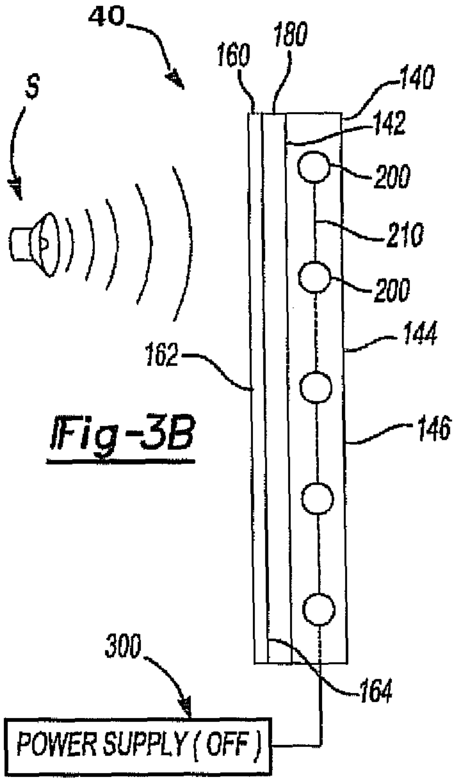
FIG. 3B is a side view of the embodiment shown in FIG. 3A
Figure 3C:
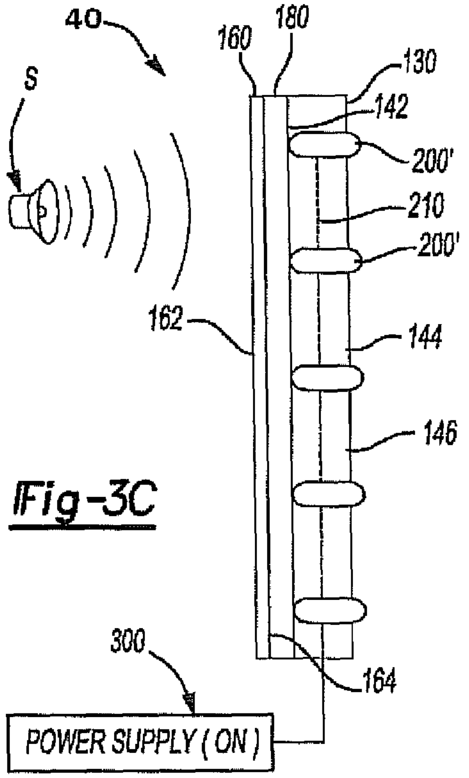
FIG. 3C is the embodiment shown in FIG. 3B illustrating activation of an electroactive activator in a first orientation.
Figure 3D:
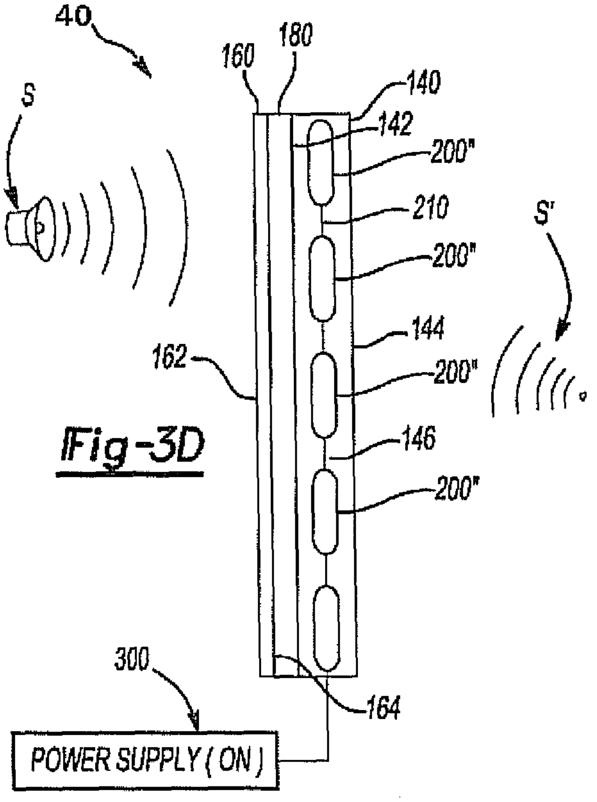
FIG. 3D is the embodiment shown in FIG. 3B illustrating activation of an electroactive activator in a second orientation.

Turning now to FIGS. 3A-3D, yet another embodiment of a panel is shown generally at reference numeral 40. In this embodiment, a substrate 180 is present between the outer layer 160 and a third layer 140. The third layer 140 is similar to the second layer 130 illustrated in FIGS. 2A-2D and includes the electroactive actuator 200 that is at least partially therewithin and optionally has a fill material 146 between surfaces 142 and 144. Similar to the previous discussion, the outer layer 160 has the outer surface 162 that faces the sound source S. Adjacent to the oppositely disposed surface 164 is the substrate 180 with the third layer 140 adjacent thereto. Similar to the discussion above, activation of the electroactive actuator 200 as illustrated in FIGS. 3C and 3D results in a change in their shape illustratively shown at 200' and 200", and thus a corresponding change in the surface roughness (not shown) and/or stiffness of the layer 140 and panel 40.

Also shown in FIG. 3D is a second sound source S' adjacent to the third layer 140. It is appreciated that activation of the electroactive actuator(s) 200 as discussed above can effect how sound from the second sound source S' is reflected, transmitted and/or absorbed by the panel.

A change in the surface roughness and stiffness of the panel will alter how sound waves will be reflected, absorbed, transmitted and the like by/through the panel. In this manner, the reflection, absorption, transmittance and the like of sound waves that impact the panel from whichever side can be altered.

In use, a panel as described above can have its sound quality characteristics altered during assembly of the motor vehicle, during use of the motor vehicle, and/or during maintenance checkups of the motor vehicle. Thus it is appreciated that control of the activation of the electroactive actuator(s) and thus the surface roughness and/or stiffness of such a panel may or may not be adjustable by an occupant of a vehicle. However, it is appreciated that during different noise scenarios, e.g. when a motor vehicle is traveling down a road, it can be desirable for an occupant to have the ability to change the sound quality of the panel and thereby improve the sound quality of music being played within the vehicle, decrease the road noise experienced by an occupant within the vehicle and the like.

The invention is not restricted to the illustrative examples described above. The examples are not intended as limitations on the scope of the invention. Methods, apparatus, compositions and the like described herein are exemplary and not intended as limitations on the scope of the invention. Changes therein and other uses will occur to those skilled in the art. The scope of the invention is defined by the scope of the claims.

I claim:

1. A panel operable to change at least one of its surface roughness and stiffness, said panel comprising:

a layer having an outer surface for facing a sound source and an inner surface oppositely disposed therefrom; and a plurality of spaced apart electroactive actuators at least partially within said layer, said plurality of spaced apart electroactive actuators operable to change physical dimensions of said layer from a first shape to a second shape for a predetermined period of time when a voltage is applied thereto, the change in shape altering at least one of surface roughness and stiffness of said layer from a first state when the voltage is not applied to said plurality of electroactive actuators to a second state after the voltage is applied to said plurality of electroactive actuators.

2. The panel of claim 1, wherein said plurality of electroactive actuators are located at predetermined positions at least partially within said layer.

3. The panel of claim 2, wherein said plurality of electroactive actuators are electrically connected to each other.

4. The panel of claim 1, further comprising an electrical power source electrically connected to said electroactive actuator.

5. The panel of claim 1, wherein said plurality of electroactive actuators are made from an electroactive polymer.

6. The panel of claim 5, wherein said electroactive polymer is a dielectric electroactive polymer.

7. The panel of claim 6, wherein said dielectric electroactive polymer is a polymer selected from the group consisting of silicones and acrylic elastomers.

8. The panel of claim 5, wherein said electroactive polymer is an ionic electroactive polymer.

9. An interior panel for an interior of a vehicle, said panel comprising:

an outer layer having an outer surface for facing a sound source in the interior of the vehicle and an inner surface oppositely disposed from said outer surface;

an inner layer adjacent said inner surface of said outer layer, said inner layer having a plurality of electroactive actuators at least partially therewithin;

said plurality of electroactive actuators operable to change physical dimensions of said inner layer from a first shape to a second shape for a predetermined period of time when a voltage is applied thereto, the change in shape altering at least one of surface roughness and stiffness of said outer layer from a first state when the voltage is not applied to said plurality of electroactive actuators to a second state after the voltage is applied to said plurality of electroactive actuators.

10. The panel of claim 9, wherein said plurality of electroactive actuators are electrically connected to each other.

11. The panel of claim 9, further comprising an electrical power source electrically connected to said plurality of electroactive actuators.

12. The panel of claim 9, wherein said plurality of electroactive actuators are made from an electroactive polymer.

13. The panel of claim 12, wherein said electroactive polymer is a dielectric electroactive polymer.

14. The panel of claim 13, wherein said dielectric electroactive polymer is a polymer selected from the group consisting of silicones and acrylic elastomers.

15. The panel of claim 12, wherein said electroactive polymer is an ionic electroactive polymer.

16. A method for adjusting at least one of surface roughness and stiffness of a panel in order to alter its sound quality, the method comprising:

providing a panel having:

an outer layer having an outer surface facing a sound source and an inner surface oppositely disposed from said outer surface; and an inner layer adjacent said inner surface of said outer layer with a plurality of electroactive actuators at least partially therewithin, said plurality of electroactive actuators operable to change physical dimensions of said inner layer from a first shape to a second shape for an extended period of time when a voltage is applied thereto;

providing an electrical power source electrically connected to each of said plurality of electroactive actuators; and applying a voltage to said plurality of electroactive actuators, the applied voltage resulting in a change of physical dimensions of said inner layer from said first shape to second shape for said extended period of time and a subsequent change of at least one of surface roughness and stiffness of said outer layer from a first state when the voltage is not applied to said plurality of electroactive actuators to a second state after the voltage is applied to said plurality of electroactive actuators.

17. The method of claim 16, wherein said plurality of electroactive actuators are made from an electroactive polymer.

18. The method of claim 17, wherein said electroactive polymer is a dielectric electroactive polymer.

19. The method of claim 17, wherein said electroactive polymer is an ionic electroactive polymer.

* * * * *